US007389459B2

(12) United States Patent
Blasco Allue et al.

(10) Patent No.: US 7,389,459 B2
(45) Date of Patent: *Jun. 17, 2008

(54) PROVISION OF DEBUG VIA A SEPARATE RING BUS IN A DATA PROCESSING APPARATUS

(75) Inventors: Conrado Blasco Allue, Austin, TX (US); Stephen John Hill, Austin, TX (US); David James Williamson, Austin, TX (US)

(73) Assignee: ARM Limited, Cambridge (GB)

( * ) Notice: Subject to any disclaimer, the term of this patent is extended or adjusted under 35 U.S.C. 154(b) by 373 days.

This patent is subject to a terminal disclaimer.

(21) Appl. No.: 11/085,598

(22) Filed: Mar. 22, 2005

(65) Prior Publication Data

US 2006/0218448 A1    Sep. 28, 2006

(51) Int. Cl.
  *G01R 31/28*   (2006.01)
  *G11C 29/00*   (2006.01)
  *G11C 7/00*    (2006.01)
(52) U.S. Cl. .................... 714/733; 714/718; 365/201
(58) Field of Classification Search .............. None
  See application file for complete search history.

(56) References Cited

U.S. PATENT DOCUMENTS

| 5,119,481 | A  | * | 6/1992  | Frank et al.      | 710/100 |
| 7,107,394 | B2 | * | 9/2006  | Johnson           | 711/110 |
| 7,188,277 | B2 | * | 3/2007  | Johnson           | 714/30  |
| 2004/0193790 | A1 | * | 9/2004  | Johnson        | 711/110 |
| 2004/0205404 | A1 | * | 10/2004 | Johnson        | 714/30  |
| 2005/0172180 | A1 | * | 8/2005  | Damodaran et al. | 714/723 |
| 2006/0031593 | A1 | * | 2/2006  | Sinclair        | 709/251 |
| 2006/0218449 | A1 | * | 9/2006  | Blasco Allue et al. | 714/45 |

FOREIGN PATENT DOCUMENTS

DE    3628299 A    *    2/1988

(Continued)

OTHER PUBLICATIONS

"Implementation of a Generic Monitoring Architecture in a Ring Message Router" by Paganelli et al. Euromicro.Workshop on Parallel and Distributed Processing, Publication Date: Jan. 27-29, 1993 pp. 330-337 ISBN: 0-8186-3610-6.*

(Continued)

*Primary Examiner*—Cynthia Britt
(74) *Attorney, Agent, or Firm*—Nixon & Vanderhye P.C.

(57) ABSTRACT

A data processing apparatus is provided having a plurality of functional units. At least one of the functional units is operable to perform data processing operations and at least a subset of the plurality of functional units have at least one of a respective co-processor register for storing configuration data and a respective debug register for storing debug data. A debug controller outputs debug data and co-ordinates debug operations. A configuration ring-bus provides a ring path for communication of configuration instructions between a first ring sequence of the plurality of functional units and a debug ring-bus provides a ring path for communication of the debug data between a second ring sequence of the plurality of functional units. Separate provision of the debug ring-bus and the configuration ring-bus provides independent access to the co-processor register and to the debug register.

22 Claims, 10 Drawing Sheets

FOREIGN PATENT DOCUMENTS

WO    WO 8801410 A2 *  2/1988

OTHER PUBLICATIONS

"External Memory BIST for System-in Package" by Yamasaki et al. IEEE International Test Conference Proceedings. ITC 2005. Publication Date: Nov. 8-10, 2005 pp. 1-10 ISBN: 0-7803-9038-5 INSPEC Accession No. 9004645.*

"Replay Debugging of Real-time Systems Using Time Machines" by Thane et al. International Parallel and Distributed Processing Symposium Proceedings. Publication Date: Apr. 22-26, 2003, 8 pages ISSN: 1530-2075 ISBN: 1530-2075 ISBN: 0-7695-1926-1 INSPEC Accession No. 7891474.*

* cited by examiner

PROVISION OF DEBUG VIA A SEPARATE RING BUS IN A DATA PROCESSING APPARATUS

BACKGROUND OF THE INVENTION

1. Field of the Invention

The present invention relates to data processing. In particular, the present invention relates to performing debug operations for data processing hardware.

2. Description of the Prior Art

It is known to provide debug functionality for production testing of data processing hardware using a serial scan-chain interface. One such scan interface is the IEEE 1149 standard "Standard Test Access Port and Boundary-Scan Architecture", written by the Joint Test Action Group (JTAG). The JTAG standard defines a five-pin serial protocol for accessing and controlling signal-levels within a digital circuit using serial scan chains.

It is known to configure a data processing apparatus by sending configuration data to each of a plurality of functional units of the data processing apparatus across a bus. The configuration data comprises access operations for transferring data from main registers to co-processor registers associated with at least a subset of the functional units. Although re-use of a functional data path for debug operations would provide for more flexibility and greater efficiency in performing debug operations, there is a risk that by communicating functional data, such as processor configuration data, on the same bus as the debug data that the debug operations themselves could interfere with the data processing operations being performed. For example, if a data processing operation tries to execute a configuration instruction whilst a debug access is being communicated on the bus, then this configuration instruction will have to have at least one stall-cycle inserted. Thus, the use of the functional bus to distribute debug data can be intrusive to the processing operations themselves. It is highly desirable that a debug system should not in any way impact upon the actual execution of the process in operation. Insertion of extra stall cycles can itself introduce or remove bugs in a system. Hence, there is a requirement to provide a debug system that is non-intrusive to the processing operations of the system that is being debugged.

SUMMARY OF THE INVENTION

According to a first aspect the present invention provides an apparatus for processing data, said apparatus comprising:

a plurality of functional units, at least one of said functional units being operable to perform data processing operations and at least a subset of said plurality of functional units having at least one of a respective co-processor register for storing configuration data and a respective debug register for storing debug data;

a configuration ring-bus arranged to provide a ring path for communication of configuration instructions between a first ring sequence of said plurality of functional units; and a debug ring-bus arranged to provide a ring path for communication of debug data between a second ring sequence of said plurality of functional units;

wherein separate provision of said debug ring-bus and said configuration ring-bus provides independent access to said co-processor register and to said debug register.

The present invention recognises that although a possible alternative to a JTAG scan interface to debug data processing hardware could be provided by communicating debug access operations on the configuration bus of the main processing circuitry, this could be disadvantageous due to the conflict for bus resources between the configuration operations and the debug operations. In particular, if a request for access to a debug register should coincide with a request for access to a configuration register, then the debug operations could actually stall the configuration process by one or more processing cycles. Hence the effectiveness of the debug process could be compromised since the debug operations could alter the progress of the computation by potentially introducing bugs that are artefacts of the debug operations themselves.

The present invention provides debug ring-bus arranged to provide a ring path for communication of debug data between a ring sequence of functional units of the data processing apparatus. This debug ring-bus is provided in addition to a configuration ring-bus so that independent access is provided to co-processor registers, which store configuration data and to debug registers, which store debug data. Thus, a debug controller can be provided as part of the main data processing circuitry and can exploit a communication path similar to but separated from the communication path used to communicate configuration data.

It will be appreciated that instructions output onto the configuration ring-bus or the debug ring-bus could be identified for execution by an appropriate one of the plurality of functional units in a number of different ways, for example, using an identifier field associated with the instruction. However, in one embodiment, the data processing circuitry comprises decoding circuitry operable to identify which of the plurality of functional units should execute a respective instruction.

The decoding of data access instructions output onto the configuration ring-bus, or the debug ring-bus, could be performed centrally and in full by a given one of the plurality of functional units of the data processing apparatus, for example by a main instruction decode unit. However, in one embodiment the decoding is distributed between a plurality of different functional units of the data processing apparatus such that at least two functional units each perform at least partial decoding of instructions. This reduces the complexity of the decoding circuitry by allowing for a plurality of simpler decoding circuits to perform the function otherwise performed by a single decoding circuit.

Since the debug operations and the configuration operations are orthogonal in functionality, the first ring-sequence could comprise a different ring ordering of functional units. However, in one embodiment, the first ring sequence, which is associated with the configuration ring-bus, is identical to the second ring-sequence, which is associated with the debug ring-bus. This simplifies the layout of the data processing hardware, making it easier to manufacture.

Although read data or write data associated with an access request to access data in the co-processor register or the debug register could be output together with the access request or a variable number of processing cycles after the access request, in one embodiment the data associated with an access request is output in a processing cycle immediately following output of the access request by at least one of the plurality of functional units. This simplifies correlation between an access request and the associated data.

Although the configuration ring-bus could implement a bus communication protocol having a request signal but no acknowledgement signal, in one embodiment the configuration ring-bus implements an acknowledge protocol to indicate that an instruction output onto the ring-bus has been executed by one of the plurality of functional units. This allows the data processing apparatus to keep track of execution of issued instructions and provides a mechanism for monitoring and recovering from unexecuted instructions. In one embodiment the recovery mechanism involves generating an undefined instruction exception in the event that the acknowledge signal or lack thereof indicates that none of the plurality of functional units has executed the instruction although an associated request has been passed all of the way round the first ring-sequence or the second ring-sequence. Thus the data processing apparatus can perform emulation to execute that instruction or take other action.

It will be appreciated that debug data could be generated within the circuitry of the data processing apparatus. However, in one embodiment, the debug controller comprises an external bus interface operable to receive debug data from an external source. Locating the external bus interface in the ring data path of the debug ring-bus facilitates efficient distribution of debug data to the plurality of functional units. In one embodiment, where the debug ring-bus operates according to a bus protocol, the passage of data to the debug ring-bus directly from the external interface is simplified since it can be performed without the requirement to implement a complex protocol to interface between data arriving via the external interface and data output onto the debug ring-bus. In one particular embodiment, the external interface implements an AMBA bus protocol.

Although the same bus communication protocol could be used to connect all of the plurality of functional units of the configuration ring-bus and the same bus communication protocol could be used to connect all of the plurality of functional units of the debug ring-bus, in one embodiment one of the plurality of functional units is an instruction decode unit and another of the functional units is an instruction execution unit and the instruction decode unit is operable to communicate with the instruction execution unit on at least one of the configuration ring-bus and the debug ring-bus using a bus communication protocol that differs from the bus communication protocol used for communication between remaining ones of said plurality of functional units on a respective one of the configuration ring-bus and the debug ring-bus. This provides for a simplified interface between selected ones of the functional units where the full functionality of the bus protocol implemented by the remaining ones of the functional units is not required.

It will be appreciated that a data access read request or write request could be communicated on the debug ring-bus or the configuration ring-bus only as far as the functional unit to which the data access and not forwarded to subsequent functional units in the second ordered sequence. However, in one embodiment the configuration ring-bus and/or the debug ring-bus are operable to communicate the data access request to each of the plurality of functional units of the first ring sequence and/or the second ring sequence. This provides a convenient mechanism for monitoring progress and execution of access requests within the data processing apparatus.

It will be appreciated that the data processing apparatus having a configuration ring-bus and a debug ring-bus could be any one of a number of different types of data processing apparatus. However, in one embodiment, the data processing apparatus is a superscalar processor operable to concurrently execute independent processing instructions.

According to a second aspect the present invention provides a method of processing data, said method comprising the steps of:

performing data processing operations using a plurality of functional units, at least one of said functional units being operable to perform data processing operations and at least a subset of said plurality of functional units having at least one of a respective co-processor register for storing configuration data and a respective debug register for storing debug data;

providing a first ring path for communication of configuration instructions between a first ring sequence of said plurality of functional units; and providing a second ring path for communication of said debug data between a second ring sequence of said plurality of functional units;

wherein separate provision of said first ring path and said second ring path provides independent access to said co-processor register and to said debug register.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
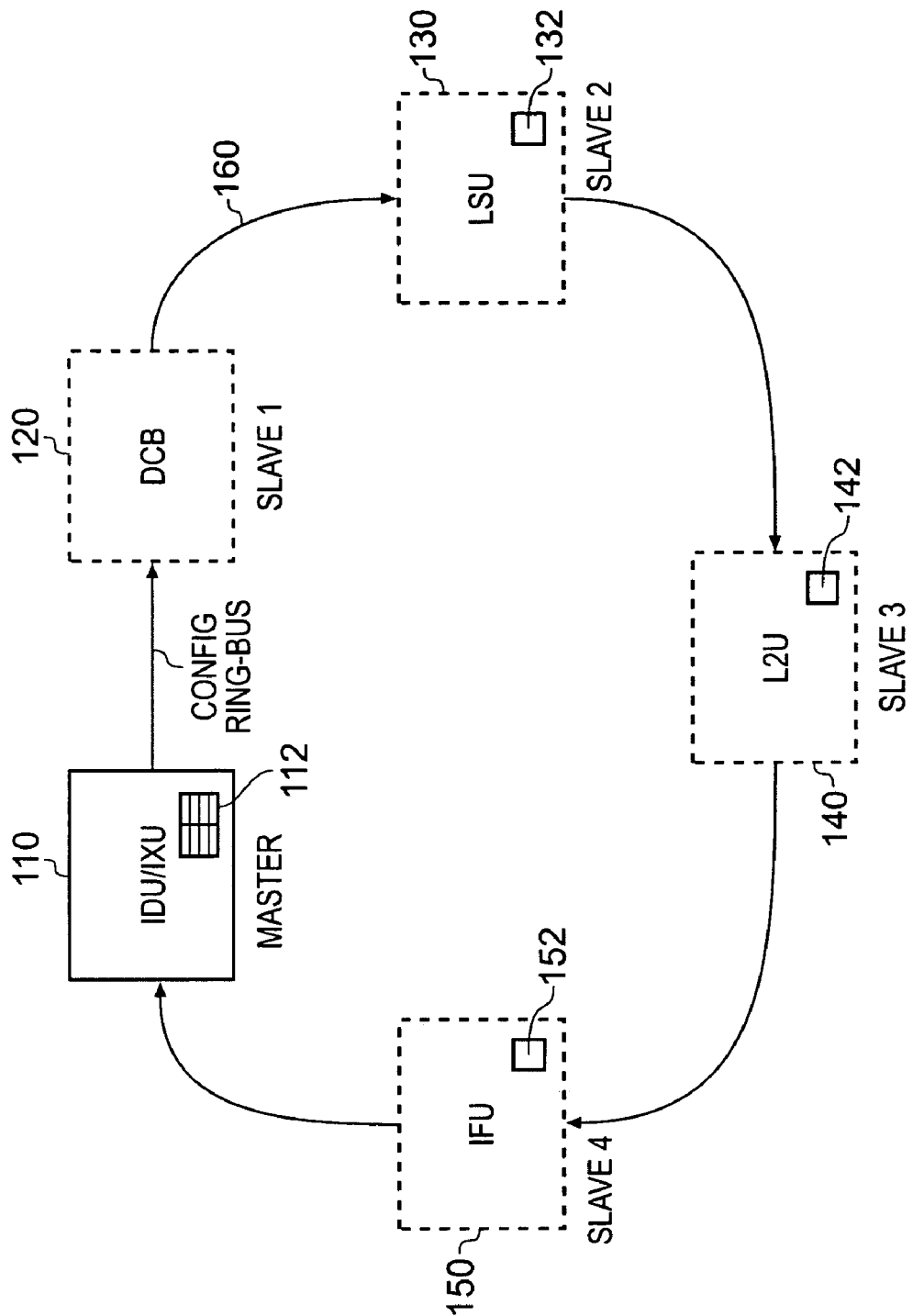
FIG. 1 schematically illustrates a configuration ring-bus.

FIG. 1 schematically illustrates a configuration ring-bus. The arrangement comprises an instruction decode unit (IDU) combined with an instruction execution unit (IXU) 110, a debug control block 120, a load/store unit 130, an L2 cache controller 140, and an instruction fetch unit 150. Each of these units corresponds to a functional unit of the data processing apparatus. These five function units 110, 120, 130, 140, 150 are connected to each other according to a ring ordering by a configuration ring-bus 160. In this arrangement, communication on the configuration ring-bus 160 originates from a master device which is the IDU/IXU unit 110 and progresses to the debug control block 120 which acts as a first slave device and subsequently to the load store unit 130 corresponding to a second slave device then to the L2 cache controller 140 corresponding to the third slave device and finally to the instruction fetch unit 150 which corresponds to a fourth save device. The ring of communication is completed by passing data from the fourth slave device 150 back to the master device, the IDU/IXU 110. The data processing apparatus comprises further functional units which are not connected by the configuration ring-bus 160 and are not illustrated.

The configuration ring-bus 160 is used to communicate configuration data and configuration instructions between the functional units of the ring sequence. The IDU/IXU 110 comprises a main register bank 112 whilst a subset of the functional units each comprise co-processor registers 132, 142, 152. In particular, the load/store unit 130 has associated co-processor registers 132, the L2 cache controller 140 comprises co-processor registers 142 and the instruction fetch unit 150 comprises co-processor registers 152. In order to configure the data processing apparatus, configuration data values from the main registers 112 can be written to any one of the co-processor registers 132, 142 or 152. Similarly, currently set values stored in the co-processor registers can be read from those registers by the IDU/IXU 110. Thus, the co-processor registers 132, 142, 152 control particular aspects of the set up of the data processing apparatus. The co-processor registers can be accessed using either an MRC instruction or an MCR instruction. The MRC instruction is operable to transfer a co-processor register value to the main registers 112 whereas the MCR instruction is operable to transfer a value from the main registers 112 to one of the co-processor registers 132, 142 or 152.

The co-processor registers 132, 142, 152 store, for example, information identifying the processor, control data, such as whether operations are little endian or big endian, an indication of whether the write buffer is turned on or off, an indication of whether an on-chip memory management unit (MMU) is turned on or off and cache control information for controlling e.g. cache flush operations. Communications on the configuration ring-bus comprise access operations such as read operations and write operations. The IDU/IXU 110 initiates a request to read a value from one of the co-processor registers 132, 142 or 152 and also initiates write operations whereby a value read from the main registers 112 is communicated on the ring-bus 160 for storage in one of the co-processor registers 132, 142, or 152. If the IDU/IXU 110 requires that a value be read from the load/store unit 130, then a read request is passed from the IDU/IXU 110 around the ring sequence through the debug control block 120 and then to the load/store unit 130 where the read-instruction will be recognised upon decoding by decode circuitry within that unit and the requested read data will be output onto the ring-bus 160 for forwarding to the L2 cache controller 140 and subsequently to the instruction fetch unit 150 before it finally is passed back to the IDU/IXU unit. Thus, it can be seen that an instruction must be passed right around the ring sequence of functional units to retrieve a value from one of the co-processor registers 132, 142, 152. When a write instruction from the main registers 112 to one of the functioning unit is requested, the write operation will occur shortly after the write request is received by the relevant functional unit. However, IDU/IXU will not have the information as to whether one of the functional units decoded, recognised and executed the write request until the request has passed all the way round the ring sequence back to the IDU/IXU 110. Due to the ring sequence of communication path on the configuration ring-bus 160, it is likely to take a plurality of processing cycles to complete any given configuration register access operation. However, since access to configuration registers 132, 142 and 152 occur relatively infrequently, the cycle count required for communication on the configuration ring-bus 160 is nevertheless acceptable. Most of the configuration instructions that are communicated on the configuration ring-bus are straightforward register read/write operations. However, writes to the co-processor registers induce state changes in the processing apparatus so the IDU/IXU 110 makes sure that all other functional units are idle before allowing the data processing apparatus to proceed with such state-changing instructions, for example, an instruction to write to a control register to enable a cache memory would fall within this category. Although the instruction decode unit and the instruction execution unit are shown as a combined functional unit 110 in the arrangement of FIG. 1, it will be appreciated that in an alternative arrangement these could be provided as separate functional units connected by the ring-bus 160. Communication on the configuration ring-bus 16 is mediated by implementation of the given bus-protocol. According to this bus protocol to perform a data access operation the IDU/IXU 110 outputs the request token onto the ring-bus 160, which is passed to the next functional unit in the ring-ordering. The request token is passed to each of the functional units of the ring sequence of the ring-bus 160 in turn, but if one of the functional units recognises the instruction on decoding then it executes that instruction and indicates that it has done so by outputting an acknowledge (ack) signal on the ring-bus. If read data or write data is associated with the request token, then that data will also be communicated on the ring-bus 160 in a processor cycle immediately following the request. In the arrangement of FIG. 1, decoding of the co-processor instructions is not performed centrally by the IDU/IXU 110 but rather is distributed around the functional units of the arrangement. Accordingly, the load/store unit 130, the L2 cache controller 140 and the instruction fetch unit 150 all have decoding circuitry for the purpose of decoding at least a portion of the received configuration instructions.

Figure 2:
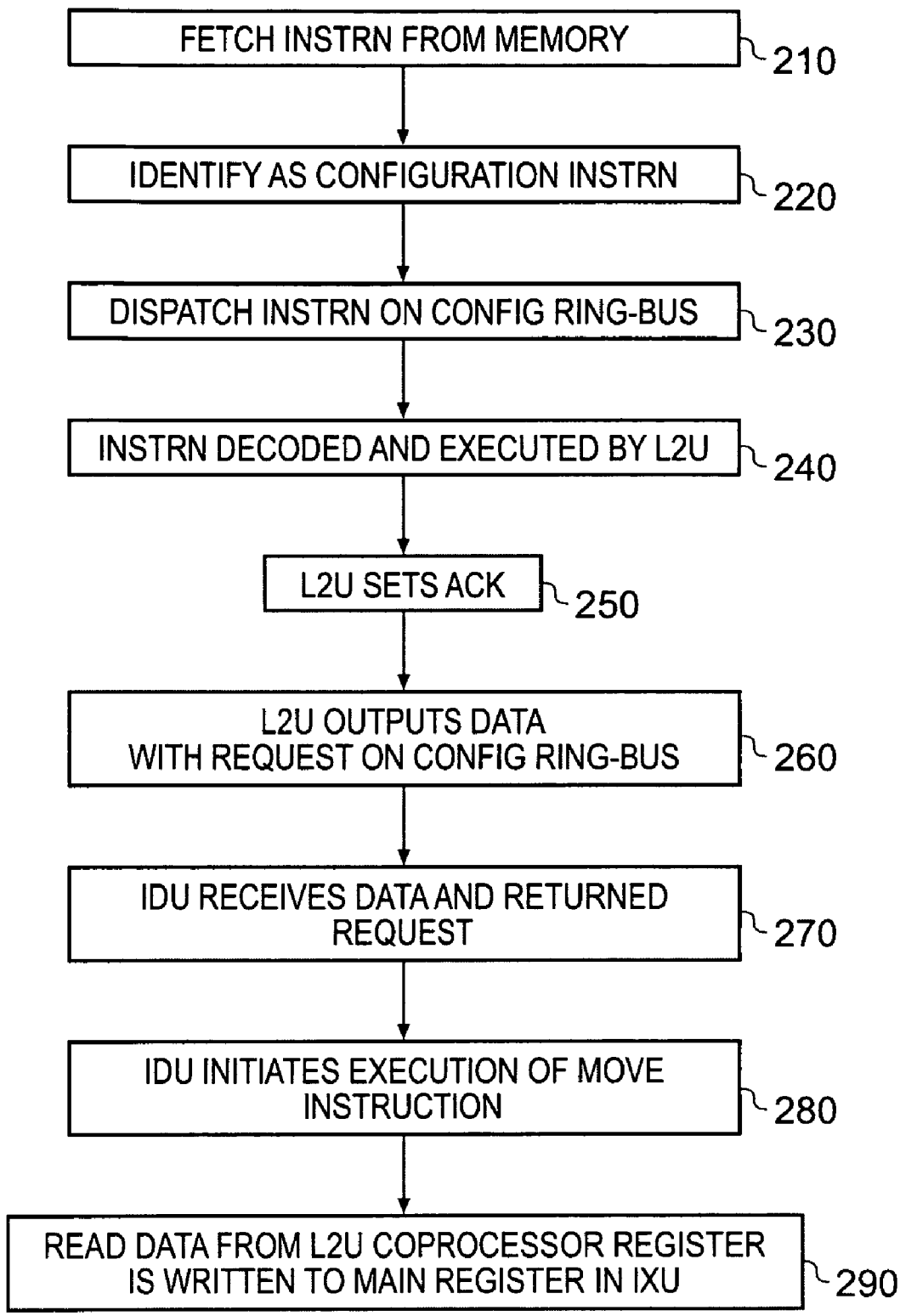
FIG. 2 is a flow chart that schematically illustrates transmission of a configuration instruction around the configuration ring-bus of FIG. 1.

FIG. 2 is a flow chart that schematically illustrates transmission of a configuration instruction around the configuration ring-bus 160 of FIG. 1. The process starts at stage 210 when an instruction is fetched from memory, subsequently at stage 220 the IDU/IXU 110 at least partially decodes the instruction and identifies that the instruction is a configuration instruction pertaining to the co-processor registers 132, 142 and 152. Accordingly, at stage 230 the IDU/IXU 110 dispatches the configuration instruction on the configuration ring-bus with a request token. The configuration instruction is passed to the debug control block 120 where it is not recognised as an instruction pertaining to that functional unit and is subsequently forwarded with the request token to the load/store unit 130. Similarly, the configuration instruction is not recognised by the load/store unit 130. The load/store unit 130 passes the request token along with the instruction to the L2 cache controller 140. When the instruction arrives at the L2 cache controller 140, it is recognised upon decoding by that functional unit as an instruction pertaining to the co-processor registers 142 and accordingly is executed by the L2 cache controller at stage 240. Next, at stage 250 the L2 cache controller 140 sets an acknowledgement (ack) signal of the bus protocol, which indicates that the instruction has indeed been recognised and executed by the functional unit. The ack signal is passed with the request token onto the configuration ring-bus and sent to the next functional unit in the ring ordering, that is the instruction fetch unit 150. At stage 260 the L2 cache controller outputs data associated with the configuration instruction, which in this case is a read request from the co-processor register 142. The read data is output in the processor cycle immediately following the output of the request signal. The instruction fetch unit 150 does not recognise the configuration instruction for execution, but simply passes on the request signal together with the read data back to the IDU/IXU 110. In a subsequent processing cycle the IDU/IXU 110 also receives the read data associated with the configuration instruction. Next at stage 280 the IDU/IXU 110 initiates execution of a move instruction to move the data read from the co-processor register 142 into the main registers 112. Finally at stage 290 the read data from the L2 cache controller 140 is written to the main register.

Figure 3:
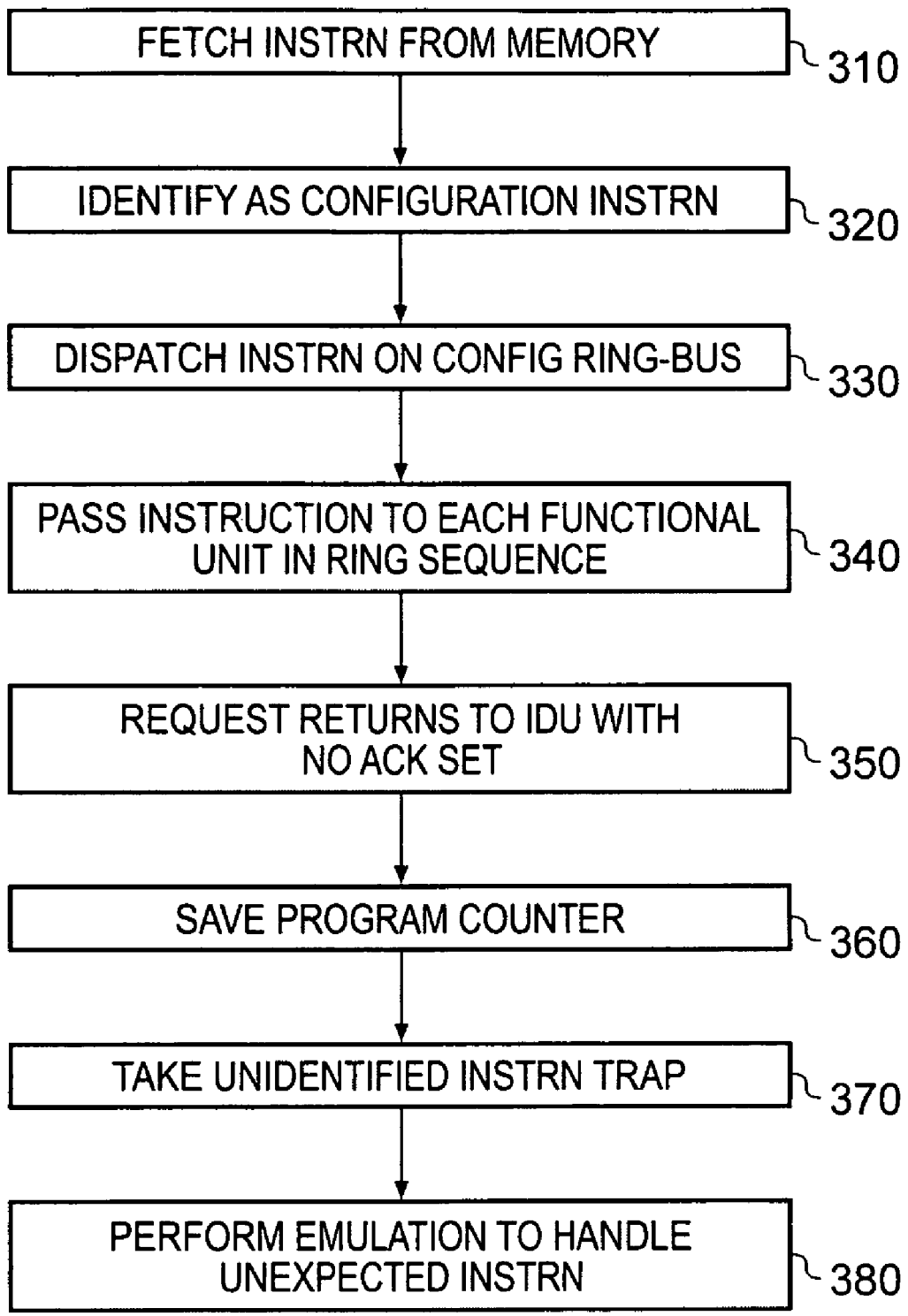
FIG. 3 is a flow chart that schematically illustrates a sequence of events that occur when a configuration instruction is not recognised.

FIG. 3 is a flow chart that schematically illustrates what happens in the event that a configuration instruction is not recognised and executed by any one of the functional units in the connected by the configuration ring-bus 160 of FIG. 1. The process starts at stage 310 where an instruction is retrieved from memory and progresses to stage 320 where that configuration that instruction is identified as a configuration instruction. As in the case of FIG. 2, the configuration instruction is dispatched on the configuration ring-bus 160 and subsequently the instruction is passed at stage 340 to each functional unit in the ring sequence in turn. However, since in this case none of the functional units 120, 130 or 150 recognises the configuration instruction as an instruction pertaining to its co-processor registers 132, 142 or 152, the configuration instruction request is passed around all of the function units in the ring sequence without an ack signal being set. Accordingly, at stage 350 the request returns to the IDU/IXU 110 with no ack having been set. In this event, at stage 360 the program counter and program status register are saved. Subsequently, at stage 370 the data processing apparatus takes an unidentified instruction trap to perform processing to remedy the fact that the instruction has not in fact been executed as required. Finally at stage 380 the data processing apparatus performs emulation to handle the un-executed configuration instruction. The emulation may involve implementing a software emulation of hardware that is not fitted. To return to normal execution, the saved program counter and program status registers are pushed to the current program counter and program status register so that execution of the instruction following the one that calls the unidentified instruction trap will ensue.

Figure 4A:
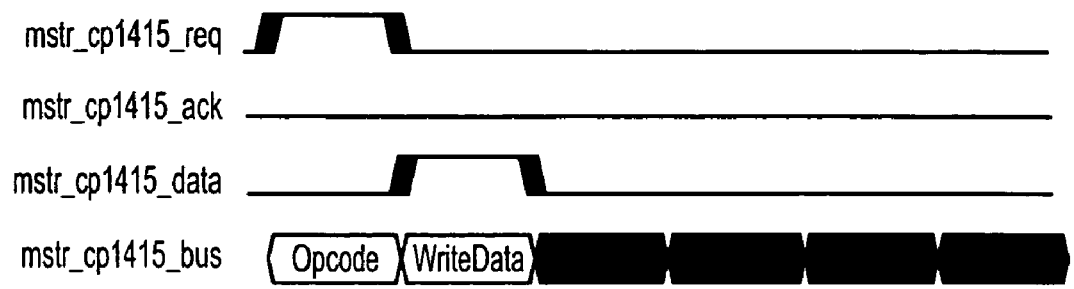
FIGS. 4A, 4B and 4C schematically illustrate timing diagrams for an instruction that copies data from a main register to the configuration register.
Figure 4B:
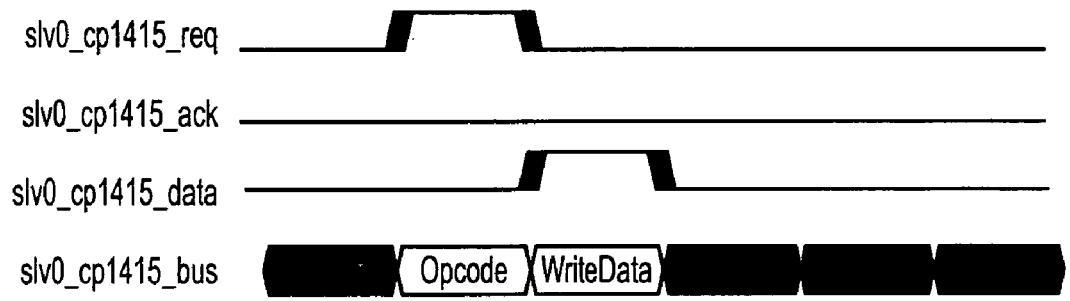
Figure 4C:

FIGS. 4A, 4B and 4C schematically illustrate timing diagrams for an MCR operation with write data. Recall that the MCR operation involves transfer of configuration data from the main register 112 to one of the co-processor registers 132, 142, 152.

FIG. 4A schematically illustrates a timing diagram for the master functional unit, which in this case is the IDU/IXU 110 of FIG. 1. As shown in FIG. 4A, the request token is output on processing cycle 0 and this is immediately followed in processing cycle 1 by the output of the data that has been read from the main register 112. The master bus signal involves transmission of an opcode, in this case a write opcode in cycle 0 and is followed in cycle 1 by output of the write data itself. It can be seen that the master ack signal remains low throughout all six cycles of the timing diagram.

FIG. 4B schematically illustrates a timing diagram for signals of a first slave device, in this case the debug control block 120 of FIG. 1. Since the debug control block 120 is the second functional unit of the ring sequence, the first functional unit being the master device 110, this slave device receives the request token at processing cycle 1. Subsequently at processing cycle 2, the associated data is output on the bus so that the data signal is high. Thus, as shown in the lowermost signal line of FIG. 4B, the opcode is output on the bus at processing cycle 1 and the write data is output on the bus at processing cycle 2. Similarly to the case of FIG. 4A, the ack signal of the first slave device remains low indicating that the debug control block did not recognise the configuration instruction as an instruction that pertained to it for execution.

FIG. 4C schematically illustrates a timing diagram for the second slave device, in this case the load/store unit 130, the configuration instruction does actually pertain to writing the main register data into the co-processor register 132 of the load/store unit 130. The load/store unit 130 receives the request token on the third processing cycle and since it recognises this configuration instruction on decoding as a configuration instruction pertaining to one of its co-processor registers 132, it sets the ack to high. It can be seen that the ack is high during the third processing cycle and is high at the same time as the request signal of this second slave device. Again, the data is output by the second slave device on the cycle immediately subsequent to the request token, that is the opcode of the bus signal is output on the third processing cycle whereas the write data is output on the fourth processing cycle. It can be seen from FIGS. 4A to 4C that the first slave device of FIG. 4B takes one cycle to decode the configuration instruction whereas the second slave device of FIG. 4C takes two cycles to decode the configuration instruction.

Figure 5:
FIG. 5 schematically illustrates the timing diagram for an instruction that travels around the configuration ring-bus without any functional unit recognising it.
Figure 5:
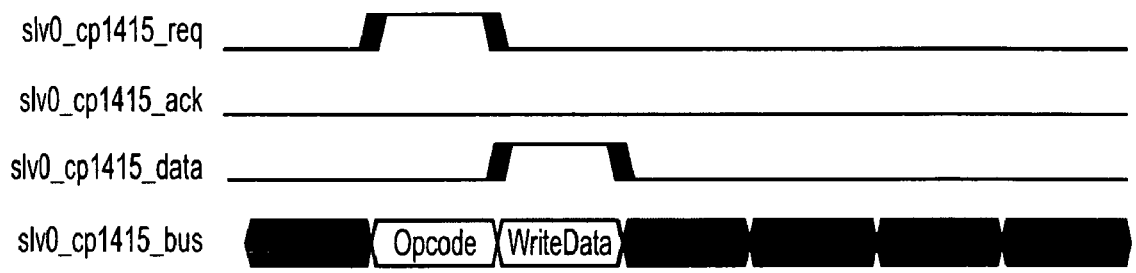
Figure 5:
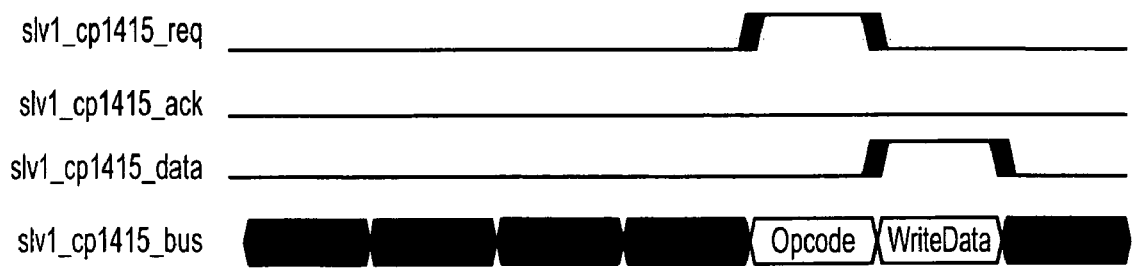

FIG. 5 schematically illustrates a timing diagram for an MCR instruction that travels all the way around the configuration ring-bus 160 without any functional unit recognising it FIG. 5 shows the signal timings of the process corresponding to the flow-chart of FIG. 3. In this case, the master function unit 110 outputs the request token at processing cycle 0 and the data is output at processing cycle 1 as in FIG. 4. The first slave device outputs the request token at processing cycle 1 and outputs the data on the subsequent processing cycle. The second slave device has a high request token at processing cycle 4, corresponding to output of the opcode on the bus and the write data is output in processing cycle 5. In this example the ring-bus 160 is considered to comprise only two slave devices but it will be appreciated that the timing diagrams could be expanded by analogy to include further slave devices. Since, in the example of FIG. 5, neither the first slave device nor the second slave device has a high ack signal at any point in the timing sequence, the MCR configuration instruction travels all the way around the ring-bus 160 without any functional unit recognising it. Thus the signal timing diagram corresponds to a situation whereupon an IDU/IXU master unit 110 will take an undefined instruction exception when the request token is received back at the master.

Figure 6:
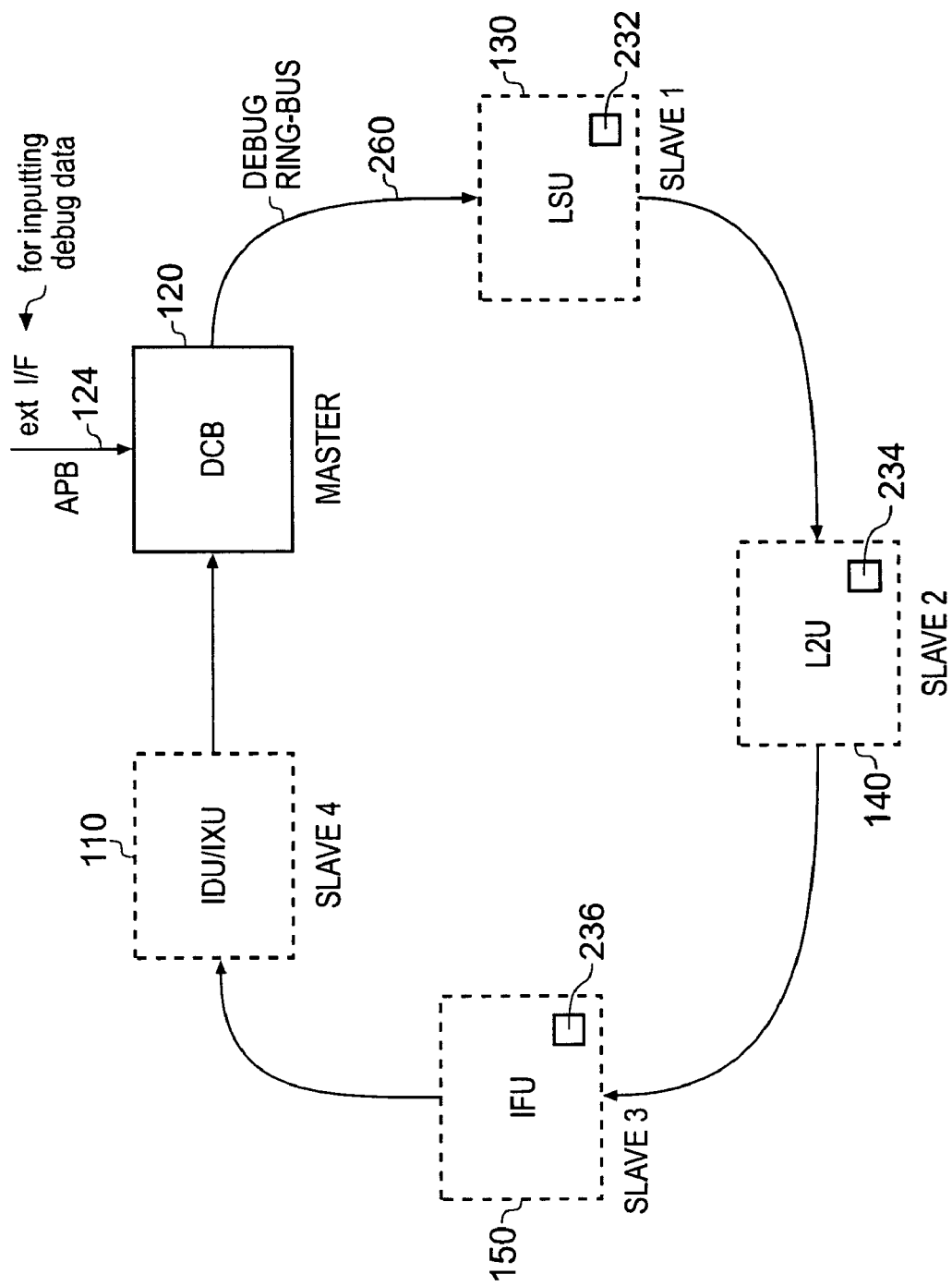
FIG. 6 schematically illustrates a debug ring-bus.

FIG. 6 schematically illustrates a debug ring-bus according to the present technique. The arrangement is similar to the arrangement of FIG. 1 in that it comprises the same functional units as in FIG. 1. However, in this case the debug control block 120 is the master device and the other functional units 110, 130, 140 and 150 are the slave devices. A debug ring-bus 160 connects the functional units according to the ring sequence, the communication sequence begins with the master device 120 and progresses to the load/store unit 130 and then to the L2 cache control unit 140 and subsequently to the instruction fetch unit 150 followed by the IDU/IXU unit 110 before returning to the master device 120. Note that the ring sequence of the arrangement of FIG. 6 is the same as the ring sequence of FIG. 1 despite the fact that the communication sequence begins at a different master device. For simplicity, the configuration ring-bus 160 and the configuration registers 132, 142 and 152 of FIG. 1 are not shown in FIG. 6.

The load/store unit 130 has a debug register bank 232, the L2 cache controller 140 also has a debug register bank 234 and similarly the instruction fetch unit 150 has debug register banks 360. The debug control block 120 comprises an external interface 124, which in this case is an AMBA peripheral bus interface. The debug control block 120 receives the debug data from an external source via the external interface 124 and outputs that debug data onto the debug ring-bus 260.

The debug control block 120 controls the setting of break points and the setting of watch points for code running in memory.

The debug registers 232, 234 and 236 are used to control debug operations associated with functionality of the respective functional unit. The debug operations are coordinated by the decode control block. The debug ring-bus 260 simplifies the processing to be performed by the decode debug control block 120 in order to pass debug data from the external interface 124 through onto the debug ring-bus 260. This is because the bus protocol that was used on the external interface is similar to the protocol used on the debug ring-bus. This simplifies the conversion of data into a suitable form.

Communication on the debug ring-bus is similar to the communication on the configuration ring-bus of FIG. 1. In this arrangement the bus communication protocol on the debug ring-bus 260 is compatible with the bus communication protocol used on the configuration ring-bus 160. However, in alternative arrangements it will be appreciated that different protocols could be used on the two ring-buses. Although the communication on the debug ring-bus 260 is similar to that on the configuration ring-bus 160, the debug ring-bus 260 communication protocol differs from that previously described in that no acknowledgement signal is used on the debug ring-bus 260. Since the debug ring-bus 260 does not have an ack signal there is no equivalent of the undefined instruction of FIG. 3 for this ring-bus. The separate provision of the debug ring-bus 260 in addition to the configuration ring-bus 160 means that debug requests do not interfere with execution of configuration instructions. This is important since debug operations should not interfere with the normal execution of the processing instructions. The configuration instructions will not be held up by the debug requests according to the arrangements of FIG. 1 and FIG. 6. This means that the reading and writing of debug registers is not intrusive in terms of processor cycle count. This avoids so-called "Heisen-bugs" whereby the debug operations themselves introduce or suppress bugs in the data processing operations.

Figure 7:
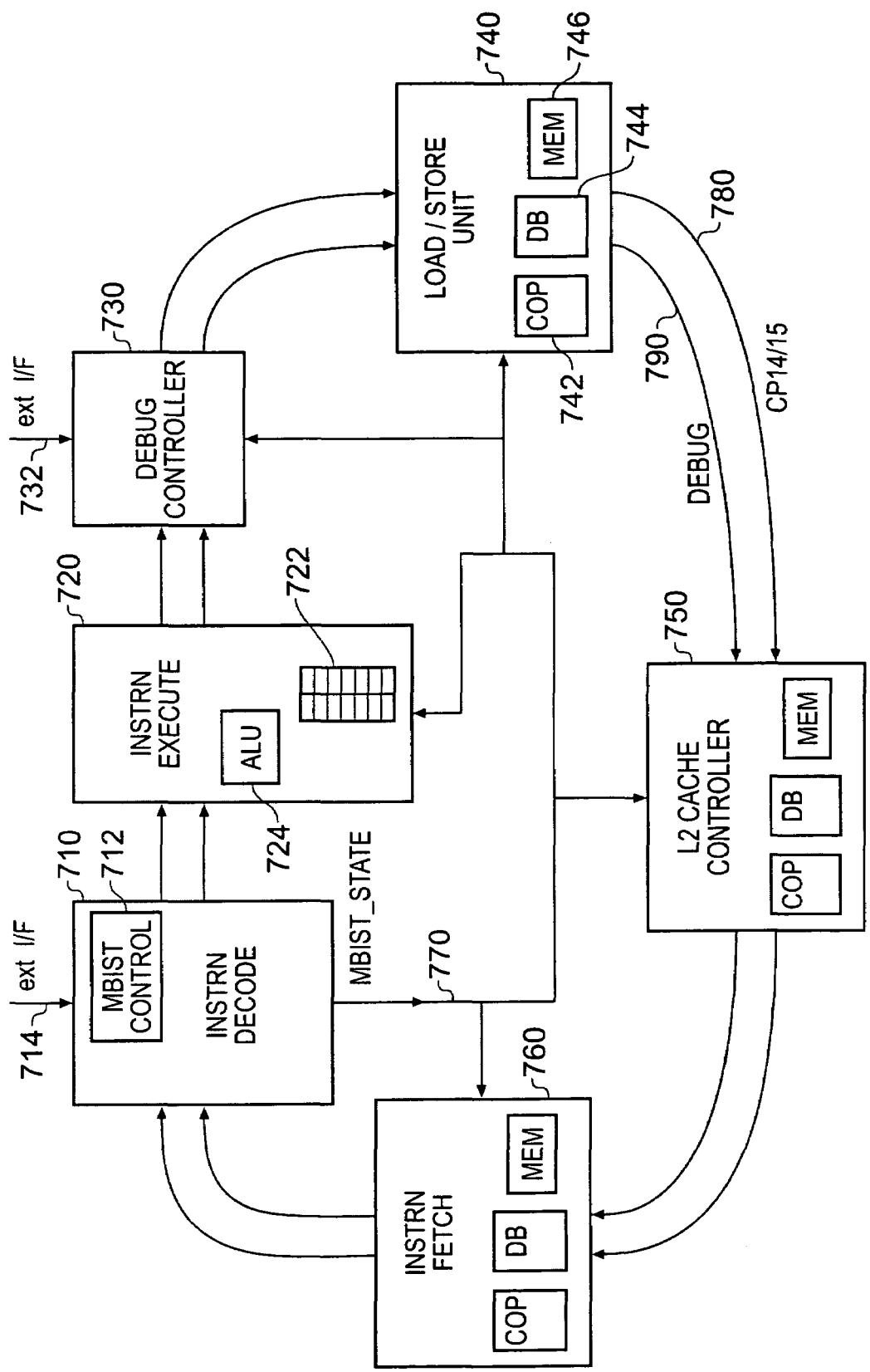
FIG. 7 schematically illustrates a self-test arrangement.

FIG. 7 schematically illustrates a self-test arrangement according to the present technique. The arrangement comprises an instruction decode unit 710 comprising a memory built-in self-test (MBIST) control module 712; an instruction execution unit 720; a debug controller 730 having an external interface 732; a load/store unit 740; an L2 cache controller 750 and an instruction fetch unit 760. The instruction decode unit 712 also has an external interface 714. The load/store unit 740, the L2 cache controller 750 and the instruction fetch unit 760 each have a co-processor register bank 742, a debug register bank 744 and a functional unit memory 746. In alternative arrangements a given functional unit could have only a subset of a co-processor register, the debug register and the functional unit memory 746, or alternatively may have none of these, as is the case for the debug controller 730 for example.

The MBIST module 712 is operable in a self-test mode to output self-test data for performing access operations to confirm correct operation of the function unit memories 746. The MBIST control module 712 implements at least one self-test algorithm that tests operation of the functional unit memories by performing write operations and read operations to particular memory cells according to a physical memory-cell pattern. This takes account of the fact that certain data storage patterns within the memory cell and certain timings of read accesses and patterns of written data can potentially lead to erroneous operation of the memory 746.

MBIST control data is received through the external interface 714. In this arrangement, the data processing apparatus is operable in both a self-test mode and an operational mode. The operational mode is defined to be any mode of operation apart from the self-test mode of operation. The self-test mode of operation is initiated by broadcasting an MBIST_state signal. This MBIST_state signal 770 is output by the instruction decode unit 710 and supplied as input via a broadcast signal to each of the other functional units of the arrangement 720, 730, 740, 750 and 760. In the self-test mode the configuration ring-bus 780 and the debug ring-bus 790 are coupled to form a combined data path that provides a combined path for communication of self-test data. In this particular arrangement, the debug ring-bus 790 and the configuration ring-bus 780 each have a 32-bit data width. Thus by combining the two ring-buses, 780, 790, a larger data width is made available for communication of self-test data. In this example arrangement it is required that the MBIST control unit 710 controls the self-test operations such that one memory access is performed per processing cycle. Due to this timing constraint, rather than waiting for the first request to propagate all the way around the ring back to the master device 710, self-test data is output onto the self-test ring-bus as back-to-back requests. In order for the coupling of the debug ring-bus 790 and the configuration ring-bus 780 to be effective, the bus communication protocols on each of these ring-buses are arranged such that they are compatible bus protocols. This differs from the arrangement of FIG. 1 and FIG. 6, where the bus communication protocols on the debug ring-bus 260 and the configuration ring-bus 160 could be different. In an alternative arrangement to that of FIG. 7, the bus communication protocols are identical as well as compatible.

Figure 8:
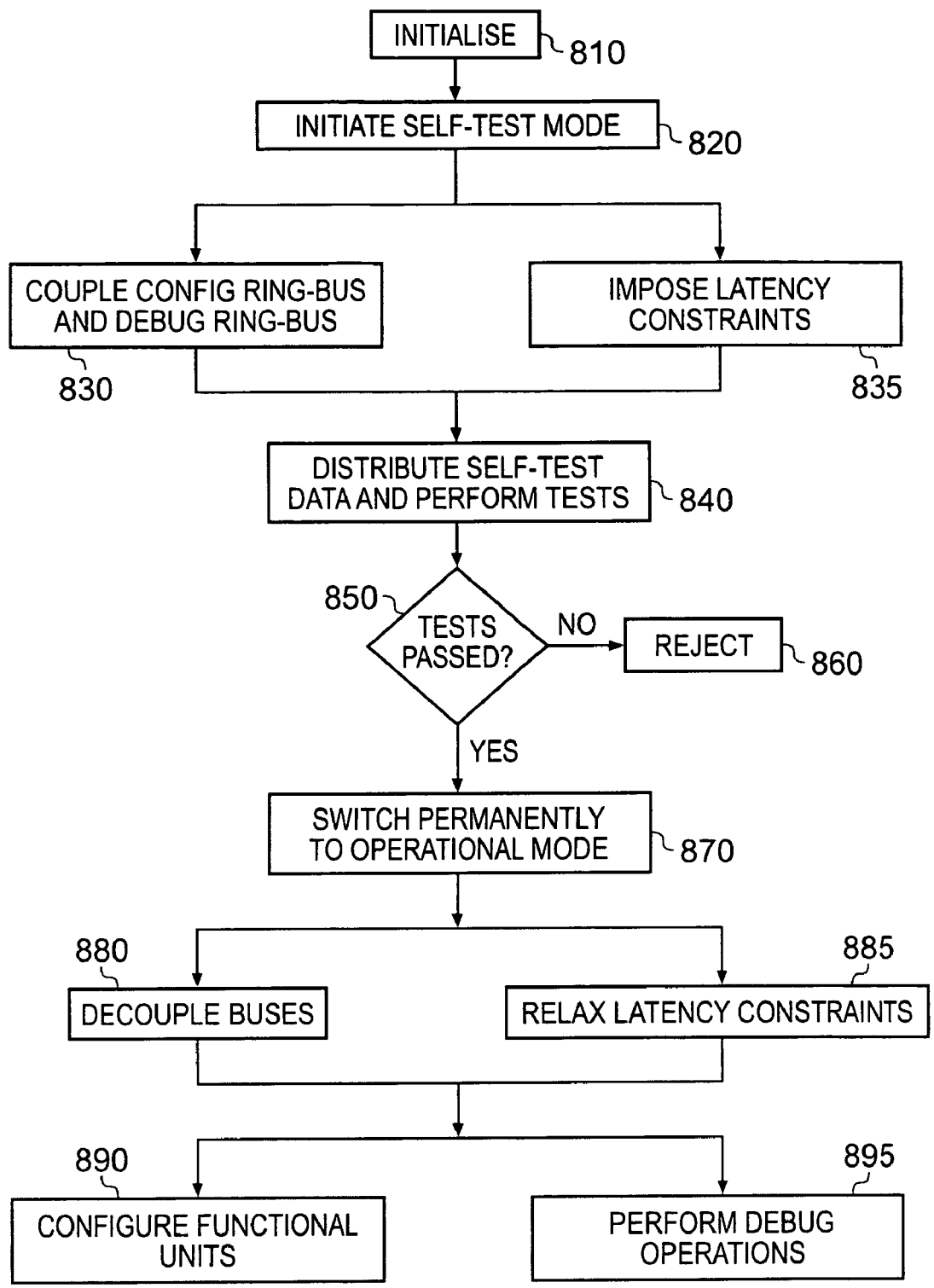
FIG. 8 is a flow chart that schematically illustrates a sequence of operations performed in two different modes of operation of the data processing apparatus of FIG. 7.

FIG. 8 is a flow chart that schematically illustrates a sequence of operations performed when the data processing apparatus of FIG. 7 operates in self-test mode and in operational mode. The process begins at stage 110 where the data processing apparatus is initialised, this stage usually is performed following fabrication of the data processing apparatus before it is shipped to customers. Following initialisation, the self-test mode is initiated at stage 820. In self-test mode, the apparatus of FIG. 7 is configured at stage 830 to couple the configuration ring-bus 780 and the debug ring-bus 790. Coupling of the two ring-buses involves selecting an appropriate bus-communication protocol. When the ring-buses 780 and 790 are coupled the self-test data is transmitted by sending a portion on the debug ring-bus 790 and an associated portion of the configuration ring-bus 780 and is arranged to arrive substantially simultaneously at each of the functional units. Although these latency constraints could be hard-wired at the system design stage, in the arrangement of FIG. 8, at least some of these latency constraints can be dynamically configured and this is performed at stage 835 at the same point as coupling the configuration ring-buses. Subsequently at stage 840 the self-test data is distributed to the appropriate functional units to test the functional unit memories of the load/store unit 740, the L2 cache controller 750 and the instruction fetch unit 760. At this stage, self-test algorithms are run to assess correct operation of the function unit memory modules 746.

At stage 850 it is determined whether the tests of correct operation of the memory have been passed or not. If one or more of the tests is not passed by a given functional unit memory then the process proceeds to step 860 where the functional unit memory is rejected as being faulty. Alternatively, further diagnostic tests may be performed at this stage. Otherwise, at stage 870 the data processing apparatus switches permanently to the operational mode. The operational mode is defined to be any mode other than the self-test modes so that in some arrangements, the apparatus could be operable in a plurality of different modes, one of which is the self-test mode and the others of which are associated with the operational mode. Once in operational mode at stage 880 the debug ring-bus 790 and the configuration ring-bus 780 are decoupled since no further self-test operations will be performed. Also, subsequently to the switch to operational mode at stage 870 the latency constraints imposed at stage 835 are relaxed at stage 885. It will be appreciated that it is optional to perform the relaxation of latency constraints at stage 885. Once the system configuration has been performed at stages 880 and 885 after an initial switch to operational mode at stage 870, the debug ring-bus 790 subsequently acts to perform debug operations at stage 895 and the configuration ring-bus 780 enables transmission of configuration data to the functional units. Thus, in the operational mode the debug ring-bus 790 and the configuration ring-bus 780 operate independently to perform orthogonal processing operations.

Figure 9:
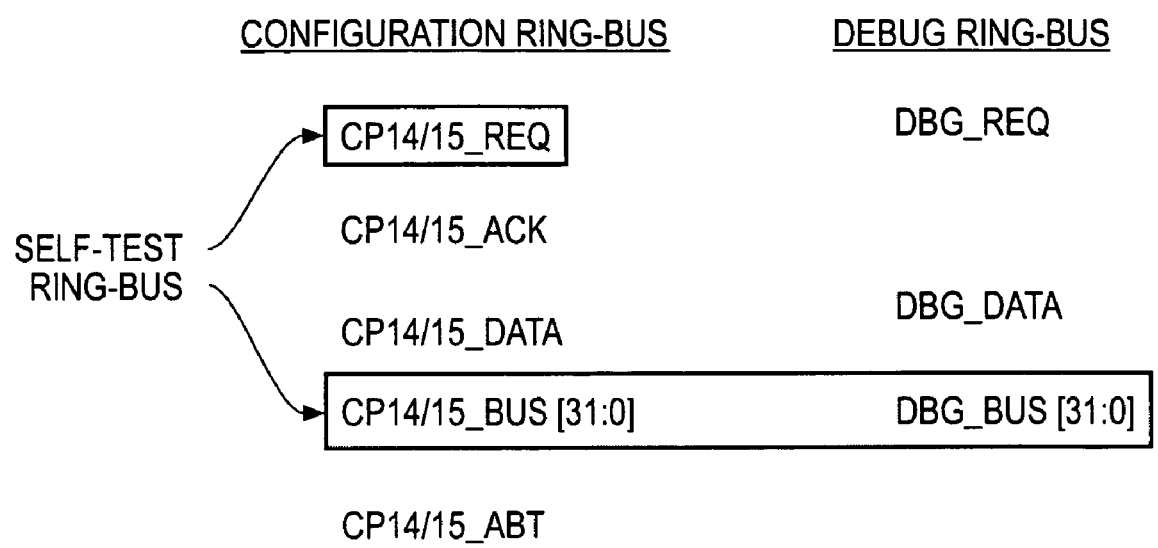
FIG. 9 schematically illustrates bus communication protocols used in the arrangement of FIG. 7.

FIG. 9 schematically illustrates the bus communication protocols used in the arrangement of FIG. 7. The configuration ring-bus 780 comprises a CP14/15_req signal, a CP14/15_ack signal, a CP14/15_data signal, a CP14/15_bus[31:0] and a CP14/15_abt abort signal. Note that co-processor registers CP14 and CP15 registers are configuration registers in this system. The CP14/15_req output passes the request token to the next functional unit in the ring sequence. The CP14/15_ack signal qualifies the CP14/15_req signal and indicates that the request token has been recognised by at least one of the functional units in the arrangement of FIG. 7. The CP14/15_bus[31:0] signal is used to communicate a 32-bit data width of configuration data around the ring-bus 780. The CP14/15_abt signal qualifies the CP14/15_req signal and indicates that the processor should take a data abort. Thus if the CP14/15_ack signal is not asserted then the CP14/15_abt signal is asserted.

The debug ring-bus 790 has a DBG_req request token which is output by a functional unit once it has completed execution of the request. This output passes the request token to the next functional unit in the ring sequence. A DBG_data signal indicates that a data cycle is on the debug ring-bus 790. A DBG_bus[31:0] signal carries address and data for the debug operations. In the self-test mode of the apparatus of FIG. 7 a new bus-protocol is defined that is effectively a hybrid of portions of the configuration ring-bus protocol and the debug ring-bus protocol. In particular, the CP14/15_req request signal is used the self-test ring-bus and both the CP14/15_bus[31:0] and the DBG_bus[31:0] signals are used to provide up to a 64-bit data width for communication of self-test data around the self-test ring-bus. Note that no acknowledge (ack) signal is used in self-test mode. Although a total maximum data width of 64-bits is available on the self-test ring-bus, it will be appreciated that the bandwidth actually utilised by the self-test data can vary from cycle to cycle such that less than the full 64-bit data width is used in some cycles whereas the full 64-bit data width is used on other cycles.

Figure 10:
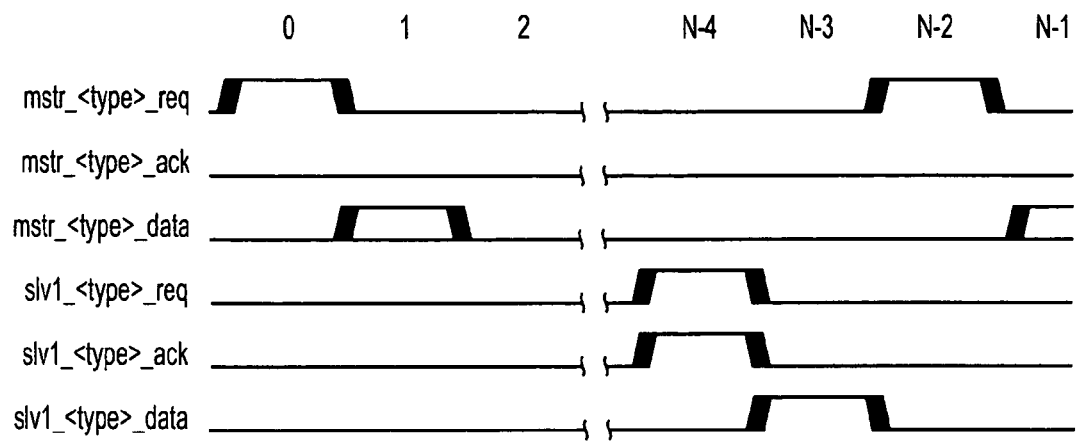
FIG. 10 schematically illustrates a timing diagram for signals on the configuration ring-bus of FIG. 1.

FIG. 10 schematically illustrates a timing diagram for signals on the configuration ring-bus 160 of FIG. 1. In this signal timing sequence the master device outputs a request token at data cycle 0 and outputs the subsequent request token at cycle N-2. The ACK signal of the master functioning unit remains low through the duration of the N processor cycles illustrated in FIG. 10. The master functional unit outputs data on the processing cycles immediately following output of the request tokens. Accordingly, the data is output at processing cycles 1 and N-1. The first slave device receives the request token at processing cycle N4 and hence outputs an ACK signal in response indicating that it has recognised and executed the request. The first slave functional unit outputs its data in the processing cycle immediately following the output of the first slave request token, that is the first slave output data at processing cycle N-3. According to the signal timing diagrams of FIG. 10, the bus protocol on the configuration ring-bus 160 is such that the master device delays output of the subsequent request token until an acknowledgement has been received at processing cycle N-4.

Figure 11:
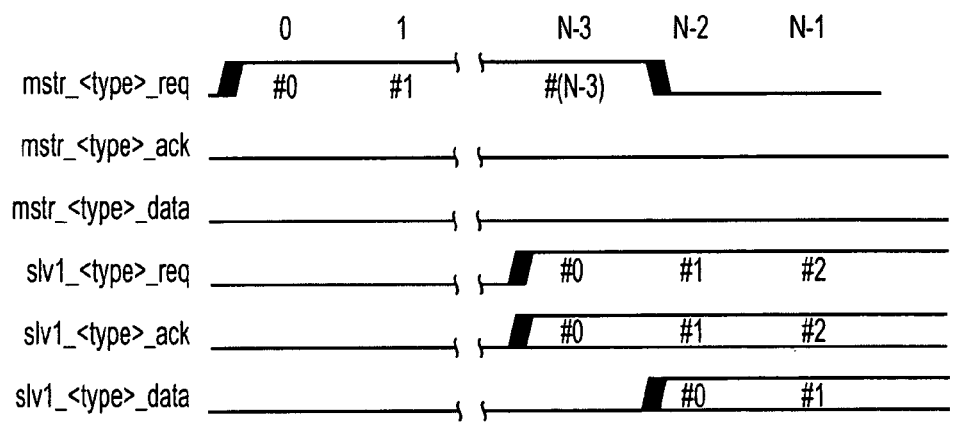
FIG. 11 schematically illustrates the timing diagram for communications on the self-test ring-bus of FIG. 7.

FIG. 11 schematically illustrates the timing diagram for communications on the self-test ring-bus of FIG. 7. In contrast to the arrangement of FIG. 10, the master in this arrangement is operable to output back-to-back request tokens onto the combined data path in self-test mode. Accordingly, the request token signal is high from processing cycle 0 through to N-2. The first slave functional unit has a high request signal from processing cycle N-3 through to processing cycle N-1 and similarly for the acknowledgement signal of the first slave device. The data output of the first slave device is delayed by one processing cycle relative to the first slave request token output and relative to the first slave acknowledge signal output. Throughout the duration of the illustrated processing cycles the ack signal of the master and the data signal of the master are low. The back-to-back output of request tokens in self-test mode is required such that a throughput of one request token per processing cycle (corresponding to one memory access per cycle) is sustained. There is a fixed latency for every request token in the sequence of operations regardless of whether or not any one of the functional units recognises that request token.

The arrangements of FIGS. 1, 6 and 7 comprise part of a superscalar processor that is operable to concurrently execute independent instructions. However, the ring-bus and coupled ring-buses described herein can also be implemented in different types of data processing apparatus.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for processing data, said apparatus comprising:
   a plurality of functional units, at least one of said functional units being operable to perform data processing operations and at least a subset of said plurality of functional units having at least one of a respective co-processor register for storing configuration data and a respective debug register for storing debug data;
   a configuration ring-bus arranged to provide a ring path for communication of configuration instructions between a first ring sequence of said plurality of functional units; and
   a debug ring-bus arranged to provide a ring path for communication of debug data between a second ring sequence of said plurality of functional units;
   wherein separate provision of said debug ring-bus and said configuration ring-bus provides independent access to said co-processor register and to said debug register.

2. Apparatus as claimed in claim 1, wherein said data processing apparatus comprises decoding circuitry and is operable to output instructions onto at least one of said configuration ring-bus and said debug ring-bus and said instructions are decoded by said decoding circuitry to identify which of said plurality of functional units should execute the respective instruction.

3. Apparatus as claimed in claim 2, wherein at least one of said plurality of functional units comprise said decoding circuitry and wherein said decoding is performed at least partially by each of said at least one functional units.

4. Apparatus as claimed in claim 1, wherein said first ring sequence is identical to said second ring sequence.

5. Apparatus according to claim 1, wherein at least one of said plurality of functional units is operable to output an access request onto at least one of said configuration ring-bus to access said configuration register and said debug ring-bus to access said debug register.

6. Apparatus according to claim 5, wherein said data processing apparatus is operable to output data associated with said access request on a respective one of said configuration ring-bus and said debug ring-bus.

7. Apparatus according to claim 6, wherein said data processing apparatus is operable to output said associated data in a processing cycle immediately following output of said access request by at least one of said plurality of functional units.

8. Apparatus according to claim 1, in which at least one of said configuration ring-bus and said debug ring-bus is operable to communicate said access request to each of the plurality of functional units of a respective one of said first ring sequence or said second ring sequence.

9. Apparatus as claimed in claim 1, wherein said configuration ring-bus implements a bus communication protocol having an acknowledge signal used to indicate that an instruction output on said configuration ring-bus has been executed by one of said plurality of functional units.

10. Apparatus as claimed in claim 9, wherein said data processing apparatus is operable to generate an undefined exception instruction in the event that said acknowledge signal indicates that none of said plurality of functional units has executed said instruction.

11. Apparatus as claimed in claim 1, wherein said debug ring-bus and said configuration ring-bus operate according to different bus communication protocols.

12. Apparatus as claimed in claim 1, wherein said debug ring-bus and said configuration ring-bus operate according to compatible bus communication protocols.

13. Apparatus as claimed in claim 1, wherein said debug controller comprises an external bus interface.

14. Apparatus as claimed in claim 13, wherein said debug ring-bus is arranged to include said external bus interface in said ring data path.

15. Apparatus as claimed in claim 13, wherein said external bus interface operates according to a bus communication protocol.

16. Apparatus as claimed in claim 15, wherein said bus communication protocol is an AMBA bus communication protocol.

17. Apparatus as claimed in claim 1, in which said plurality of functional units comprise at least one of an instruction fetch unit, a cache memory controller, a load/store unit, an instruction decoder and an instruction execution unit.

18. Apparatus as claimed in claim 1, wherein said at least one of said plurality of functional units is a memory controller and said configuration instructions comprise memory control instructions.

19. Apparatus as claimed in claim 1, wherein one of said plurality of functional units is an instruction decode unit and another of said functional units is an instruction execution unit and said instruction decode unit is operable to communicate with said instruction execution unit on at least one of said configuration ring-bus and said debug ring-bus using a bus communication protocol that differs from a bus communication protocol used for communication between remaining ones of said plurality of functional units on a respective one of said configuration ring-bus and said debug ring-bus.

20. Apparatus as claimed in claim 1, wherein said data processing apparatus is a superscalar processor operable to concurrently execute independent instructions.

21. A method of processing data, said method comprising the steps of:
performing data processing operations using a plurality of functional units, at least one of said functional units being operable to perform data processing operations and at least a subset of said plurality of functional units having at least one of a respective co-processor register for storing configuration data and a respective debug register for storing debug data;
providing a first ring path for communication of configuration instructions between a first ring sequence of said plurality of functional units; and
providing a second ring path for communication of said debug data between a second ring sequence of said plurality of functional units;
wherein separate provision of said first ring path and said second ring path provides independent access to said co-processor register and to said debug register.

22. Apparatus for processing data, said apparatus comprising:
a plurality of means for processing, at least one of said means for processing being operable to perform data processing operations and at least a subset of said plurality of means for processing having at least one of a respective means for storing configuration data and a respective means for storing debug data;
means for providing a ring path for communication of configuration instructions between a first ring sequence of said plurality of means for processing; and
means for providing a ring path for communication of debug data between a second ring sequence of said plurality of means for processing;
wherein separate provision of said means for providing a ring path for communication of configuration instructions and said means for providing a ring path for communication of said debug data provides independent access to said co-processor register and to said debug register.

* * * * *